United States Patent
Slupsky et al.

(10) Patent No.: US 9,329,579 B2
(45) Date of Patent: May 3, 2016

(54) WIRELESS SENSOR DEVICE

(75) Inventors: Steven Slupsky, Edmonton (CA); Christopher V. Sellathamby, Edmonton (CA); Brian Moore, Edmonton (CA)

(73) Assignee: Scanimetrics Inc., Edmonton, AB (CA)

( * ) Notice: Subject to any disclaimer, the term of this patent is extended or adjusted under 35 U.S.C. 154(b) by 191 days.

(21) Appl. No.: 13/883,697

(22) PCT Filed: Feb. 17, 2011

(86) PCT No.: PCT/CA2011/050100
§ 371 (c)(1),
(2), (4) Date: Jul. 1, 2013

(87) PCT Pub. No.: WO2012/058770
PCT Pub. Date: May 10, 2012

(65) Prior Publication Data
US 2013/0278377 A1   Oct. 24, 2013

Related U.S. Application Data

(60) Provisional application No. 61/410,734, filed on Nov. 5, 2010.

(51) Int. Cl.
G05B 23/00 (2006.01)
G05B 1/01 (2006.01)
G01B 21/32 (2006.01)
G01D 9/00 (2006.01)
G01H 1/00 (2006.01)
(Continued)

(52) U.S. Cl.
CPC  *G05B 1/01* (2013.01); *G01B 21/32* (2013.01);
*G01D 9/005* (2013.01); *G01H 1/00* (2013.01);
*H05K 5/065* (2013.01); *H04L 67/12* (2013.01)

(58) Field of Classification Search
CPC ......... G01B 21/32; H05K 5/065; G01H 1/00;
H04L 67/12; G05B 1/01; G01D 9/005
USPC ........................................... 340/5.1
See application file for complete search history.

(56) References Cited

U.S. PATENT DOCUMENTS

| | | | |
|---|---|---|---|
| 5,381,136 A | 1/1995 | Powers et al. | |
| 5,754,122 A * | 5/1998 | Li | H04Q 9/00 340/870.03 |

(Continued)

OTHER PUBLICATIONS

Authors S.W. Arms, C.P. Townsend, J.H. Galbreath, A.T. Newhard, "Wireless Strain Sensing Networks," 2nd European Workshop on Structural Health Monitoring, Munich, Germany, Jul. 7-9, 2004.

(Continued)

*Primary Examiner* — Naomi Small
(74) *Attorney, Agent, or Firm* — Davis & Bujold PLLC; Michael J. Bujold

(57) ABSTRACT

A wireless sensor device includes a processor connected to a wireless transmitter and at least one sensor, and a power source connected to power the processor and the wireless transmitter. The processor has two or more states. An internal control element senses at least one predetermined condition. The internal control element switches the processor between states based on the occurrence of at least one predetermined condition. A molded body encloses at least the processor, the wireless transmitter, and the internal control sensor. The internal control sensor is physically isolated within the molded body.

31 Claims, 14 Drawing Sheets

(51) Int. Cl.
*H05K 5/06* (2006.01)
*H04L 29/08* (2006.01)

(56) References Cited

U.S. PATENT DOCUMENTS

| | | | |
|---|---|---|---|
| 5,947,051 A * | 9/1999 | Geiger | B62D 57/00 114/222 |
| 6,292,108 B1 * | 9/2001 | Straser | G01B 21/32 340/539.1 |
| 6,369,715 B2 | 4/2002 | Bennett, Jr. et al. | |
| 6,553,336 B1 * | 4/2003 | Johnson | G01D 3/022 702/108 |
| 6,588,282 B2 | 7/2003 | Arms | |
| 7,081,693 B2 | 7/2006 | Hamel et al. | |
| 7,170,201 B2 | 1/2007 | Hamel et al. | |
| 7,298,259 B2 * | 11/2007 | Moriwaki | G01D 21/00 340/5.1 |
| 7,696,621 B2 | 4/2010 | Arms et al. | |
| 8,793,081 B1 * | 7/2014 | Loverich | G01L 5/0004 340/683 |
| 2003/0112137 A1 | 6/2003 | Saheki | |
| 2005/0241403 A1 * | 11/2005 | Thomson | E01D 19/00 73/773 |
| 2005/0262221 A1 * | 11/2005 | Daniels | G01D 11/24 709/219 |
| 2006/0080048 A1 * | 4/2006 | Kessler et al. | 702/35 |
| 2006/0154642 A1 * | 7/2006 | Scannell | A01G 9/02 455/404.1 |
| 2007/0150565 A1 * | 6/2007 | Ayyagari | H04L 67/12 709/223 |
| 2007/0229248 A1 * | 10/2007 | Mott | G01H 1/16 340/522 |
| 2007/0282541 A1 * | 12/2007 | Griess | H04Q 9/00 702/34 |
| 2007/0285248 A1 | 12/2007 | Hamel et al. | |
| 2009/0145242 A1 * | 6/2009 | Pryor, Jr. | G01L 5/009 73/856 |
| 2009/0322557 A1 | 12/2009 | Robb et al. | |
| 2010/0041971 A1 | 2/2010 | Goode, Jr. et al. | |
| 2010/0174576 A1 * | 7/2010 | Naylor | G06Q 10/04 701/31.4 |
| 2010/0236036 A1 | 9/2010 | Stark | |
| 2010/0308980 A1 * | 12/2010 | Gosset | G08C 19/12 340/286.02 |
| 2011/0066297 A1 * | 3/2011 | Saberi | F16K 31/046 700/287 |
| 2011/0248846 A1 * | 10/2011 | Belov | H04Q 9/00 340/539.1 |
| 2011/0273196 A1 * | 11/2011 | Hill | A01G 25/167 324/696 |

OTHER PUBLICATIONS

Author Dr. Naser El-Sheimy, Canada, Report on Kinematic and Integrated Positioning Systems, Fig XXII International Congress, Washington DC, Apr. 19-26, 2002.

www.accutechinstrumetns.com/products/ webpage, available at least as early as Dec. 19, 2009, retrieved Jan. 12, 2011, Accutech Wireless Instrumentation Products.

www.controlmicrosystems.com webpage product sheet, available at least as early as Jan. 12, 2011, retrieved Jan. 12, 2011, Control Microsystems, Product data sheet for Accutech AM20 Wireless Acoustic Monitor Field Unit.

www.microstrain.com/wireless-sensors.aspx, available at least as early as Jan. 12, 2011, retrieved Jan. 12, 2011, Microstrain Microminature Sensors Products.

* cited by examiner

WIRELESS SENSOR DEVICE

FIELD

A wireless sensor device, which may be referred to as a wireless mote herein, for attachment to a component of equipment or a structure for determining status and sensing one or more changes occurring at that component, such as strain, vibration, development of cracking, progression of cracking and temperature. The sensor is sealed so that it may be operated in either hazardous or non-hazardous environments.

BACKGROUND

Sensors are used to determine and monitor status and conditions of equipment and the environment at that equipment. For example, a sensor may be used to monitor temperature, humidity, atmosphere at an environment or other ambient conditions. Other sensors are used to monitor physical parameters of equipment, and the status of the equipment itself, including determining strain, vibration, and development of cracking.

Sensors also may be used to log data. Powers et al. in U.S. Pat. No. 5,381,136 (1995) describe a remote logger unit for monitoring a variety of operating parameters along a fluids distribution or transmission system. An RF link is activated by which a logger unit alerts a central controller when predetermined operating limits are exceeded. Farther logger units transmit data via closer logger units in daisy chain fashion.

Arms in U.S. Pat. No. 6,588,282 (2003) describes peak strain linear displacement sensor for monitoring strain in structures. The device records data and can report strain history for the structure to which it is attached. A displacement sensor is constrained so that it shows maximum movement in one direction resulting in deformation of the structure to which it is attached.

Hamel et al. in U.S. Pat. Nos. 7,081,693 (2006) and 7,170,201 (2007) describe devices for powering a load by harvesting energy as electrical energy from an ambient source, storing said electrical energy, and switching the storage device to provide electrical energy when required to a load such as a sensor. The example is provided of powering a sensor for monitoring tire pressure and transmitting that data.

Arms et al. in U.S. Pat. No. 7,696,621 (2010) and in a conference presentation, "Wireless Strain Sensing Networks," 2nd European Workshop on Structural Health Monitoring, Munich, Germany, Jul. 7-9, 2004, describe a RFID tag packaging system for an electronic device located within a cavity in an adjacent flexible material. The dimensions of the flexible material are chosen so as to provide protection of the electronic device from loading applied to the device.

A preferred approach to maintenance is "Condition-Based Maintenance" (CBM). Equipment downtime, both scheduled and unscheduled, is an important factor of production loss. In addition, according to a study by Optimal Maintenance Decisions Inc. (OMDEC), a leader in condition-based maintenance (CBM) management solutions, failures in the field are three times more costly to repair (considering overtime, rescue, and expedited shipping of parts) than scheduled (or preventive) maintenance operations.

Hence, CBM is replacing preventive maintenance in many industrial operations as a result of gains in productivity. Condition-based maintenance (CBM) is a maintenance system prevalent in industrial mining and energy operations. CBM monitors equipment to establish an optimal maintenance cycle (based on the predictions of when a machine will fail using strain and vibration measurements, for example).

While preventive maintenance repairs machinery every given time period, even if the machine is still operational, CBM can extend that time period. The optimal maintenance cycle determines the best time to shut down a machine for preventive repair. Finding the balance between repairing often and continuing to produce is the tricky part.

As an example, strain and fatigue measurements reveal risks of yield failures and cracking, changes in material properties, and remaining equipment life, making them incredibly useful for CBM if monitored.

In the mining industry, strain and vibration are not generally monitored by built-in systems, mainly due to the complexity of sensor installation and computational intensity of the data processing. CBM relies heavily on regular or continuous measurements of parameters that allow operators to determine when the machine will fail (i.e. strain and vibration).

Electronic sensors measure physical quantities (such as strain, temperature, acceleration, crack propagation, pressure, etc.) and convert them into signals read by an instrument (the reader varies depending on the type of sensor).

For example, strain gauges consist of a foil pattern (often in a tight zigzag) insulated in a flexible material and attached to an object under strain. As the object deforms, the resistance of the foil wires changes, allowing a Wheatstone bridge circuit (a measuring instrument used to measure an unknown electrical resistance) to record the variations.

Unfortunately, existing CBM solutions have been historically inaccurate, are expensive or non-viable, and/or produce poor signal transmission and short battery life.

CBM's reliance on high data volume dictates a need to monitor continuously (or at least often) strain and loading. To understand fully a machine's state requires monitoring of cracks and crack growth. However, monitoring the hundreds of machines used every day in a mining operation requires many sensors and many more wires, which are difficult and expensive to install and maintain.

Many solutions have not reliably predicted when a machine will fail. This parameter is probably the most important when it comes to CBM, since CBM relies on accurate predictions of failure. The inability to predict correctly when a machine will fail can have grave consequences on unplanned downtime as well as operator safety.

Some solutions offer accurate predictions, but at high costs, whether in the stages of installation and setup, longevity and data collection, or analysis and data post-processing.

Yet other solutions offer poor signal transmission due to low range or lack of direct line of sight. Power supplies dictate operating conditions and longevity of the solution. Most solutions require too much power to operate for long periods of time, or are too delicate to operate in the harsh conditions of mining operations. Conditions can include extreme temperatures, constant vibration, and quick acceleration.

SUMMARY

According to an aspect, there is provided a wireless sensor device, comprising a processor connected to a wireless transmitter and at least one sensor, and a power source connected to power the processor and the wireless transmitter. The processor has two or more states. There is at least one internal control element for sensing one or more predetermined conditions, the internal control element switching the processor between states based on the occurrence of at least one predetermined condition. A molded body encloses at least the processor, the wireless transmitter, and the internal control sensor such that the internal control sensor is physically isolated within the molded body.

According to another aspect, the molded body may also enclose at least one of the power source and one or more sensors connected to the processor.

According to another aspect, the processor may be connected wirelessly to a sensor that is external to the molded body or to an external sensor by conductors where a portion of the conductors is enclosed in the molded body, or both.

According to another aspect, at least one internal control element may be an accelerometer, and at least one predetermined condition may be the detection of one or more predetermined accelerations. At least one internal control element may be an RF transponder, and at least one predetermined condition may be the introduction or removal of an RF interrogator from its detection radius. At least one internal control element is a magnetic sensor, and at least one predetermined condition may be the introduction or removal of a magnetic element on an outer surface of the molded body.

According to another aspect, the molded body may enrobe at least the processor, the wireless transmitter, and the internal control sensor in a single piece construction.

According to another aspect, the at least one sensor may measure at least one of strain, cracks, crack propagation, motion, shock, acceleration, tilt, inclination, pressure, light, radiation, sound and chemical compounds.

According to another aspect, the processor may be programmed to process sensor data from the sensing element according to an algorithm and transmit the processed data by the wireless transmitter. The algorithm may be a Rainflow algorithm that generates a histogram of discrete stress ranges.

According to another aspect, the wireless transmitter may be a wireless transceiver.

According to another aspect, the wireless sensor device may comprise an attachment for attaching the wireless sensor to an object. The attachment may be at least one of a magnet, at least one welding flange, strapping, or an adhesive compound.

According to another aspect, the sensor may be a bolt tightness sensor.

According to another aspect, the processor may be configured to operate as a node in a mesh network.

According to another aspect, there is provided a method of operating a wireless sensor device, comprising the steps of: providing a wireless sensor device as described above; configuring the internal control element to switch the processor between states upon the occurrence of at least one predetermined condition; and applying at least one predetermined condition to the internal control element.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION

Figure 1:
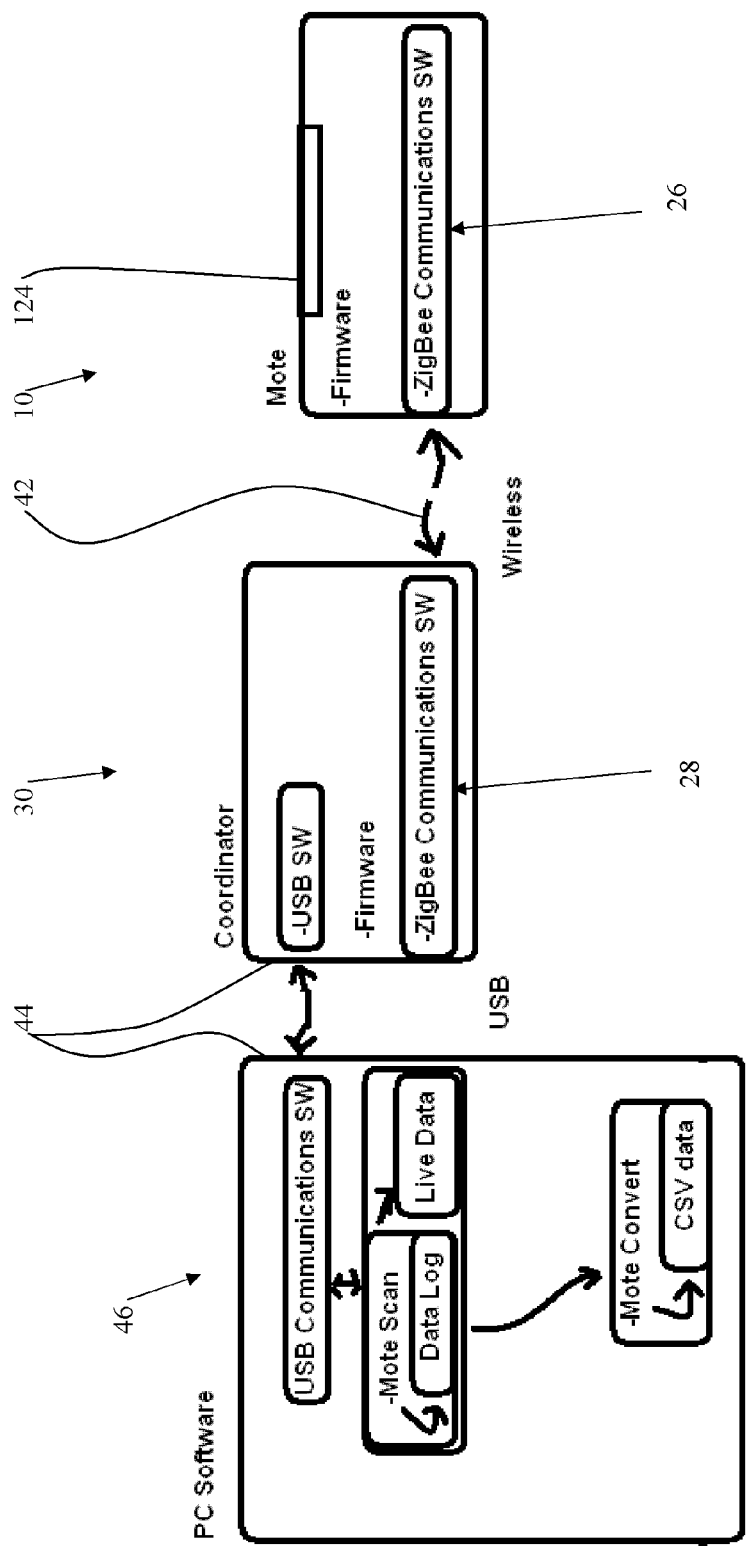
FIG. 1 shows schematically a basic wireless mote set-up.

There are many devices known to those skilled in the art for sensing various properties of matter, physical environment, and status of equipment. Typically, the data acquired by the sensor are stored and compared to predetermined values. In some cases, each reading is transmitted electronically to a central processor for evaluation. Alternatively, data may be transmitted electronically to a controller at intervals or when the data acquired fall outside predetermined limits.

Data may be transmitted using RF as described by Powers et al. in U.S. Pat. No. 5,381,136.

Sensors may be isolated from harmful environments, such as corrosive atmospheres, or hazardous conditions, such as combustible gases, by containment of the sensor within a housing.

In other sensing devices, there are requirements including available power, reliability, and protection of and from the ambient environment that limit their applicability and which reduce their utility.

In particular, sensors attached to moving components of equipment, rotating components, components may be subjected to severe stresses or vibrations. It is desirable that sensors be small and have minimal mass to minimize imbalance that could lead to wear to failure. Additionally, components at interior points of equipment can have limited visibility or "line of sight" to the other sensors and data collection points and can be "blind". It is desirable that sensors have the capability to operate independently of all other devices, and capability to transmit data wirelessly. Further, it is desirable that such systems be capable of operating in hazardous, harsh as well as laboratory or environmentally controlled environments.

The present discussion relates to a wireless mote, or sensor, that is intrinsically safe and easy to install by direct attachment to a component of equipment, and easy to use as it contains within a protective body all components necessary for its intended purpose, such as components for sensing, communications, a tap sensitive user interface, a durable power source and ultra-low power operation. Advantages accrue from inclusion of a sensor interface and data acquisition components, memory, wireless transceiver, long life battery, a magnetic sensor, and capability for software over radio updates, data logging, and power management.

This device may be used to sense the status of a component of equipment, and may be designed to provide some or all of the following advantages:

- can be securely affixed to a component of equipment located at any position within that equipment;
- is isolated from the ambient conditions so as to protect it against hazards and so that it is not at risk to cause a hazard;
- can acquire data, log data, store data and, when required, handle, analyze and compare data;
- can transmit all data, accumulated blocks of data, or selected data; and
- can receive commands for operating the data accumulation, storage and transmission functions.

The mote contains a source of power that may be batteries or, alternatively, a mote may be capable of being recharged so as to extend its operating life. Alternatively, the mote may scavenge or harvest power from its environment.

Further, to minimize power consumption, the mote may be capable of conserving power through power management functions such as operating one or more functions only when required and selectively controlling power to one or more components.

The position of a mote that is attached to moving equipment at any time can be determined using methods such as those described by El-Sheimy et al. in Report on Kinematic and Integrated Positioning Systems, FIX XXII International Congress, Washington, D.C., Apr. 19-26, 2002.

To these ends, a wireless mote 10 now will be described with reference to FIG. 1 through 5. In particular, as a non-limiting example, a wireless mote will be described for monitoring strain within a component of equipment. It will be recognized that there are many other applications for which there is use of an alternative design of wireless mote 10 based on similar design aspects.

Referring to FIG. 1, at least one wireless mote 10 is in wireless communication via link 42 with a data coordinator 30, which is in turn in communication using USB interface 44 with a computer 46 for receiving, logging, analyzing and processing data received from wireless mote 10. In a preferred embodiment, mote 10 has within a communications software stack 26 that is compliant with a Zigbee End Device and data coordinator 30 has within a communications software stack 28 that is compliant with a Zigbee Coordinator, it is recognized that there are other wireless protocols possible. USB interface 44 could be any other form of serial communication interface such as RS-232, Ethernet, modbus or controller area network ("CAN"). Moreover, USB interface 44 could be any form of wireless interface such as Bluetooth or any one of the 802.11 "Win" standards. Computer 45 could be any other form of computer such as a portable computer, smart phone such as an iPhone, Blackberry, Android, etc., or a tablet computer such as an iPad.

Figure 2:
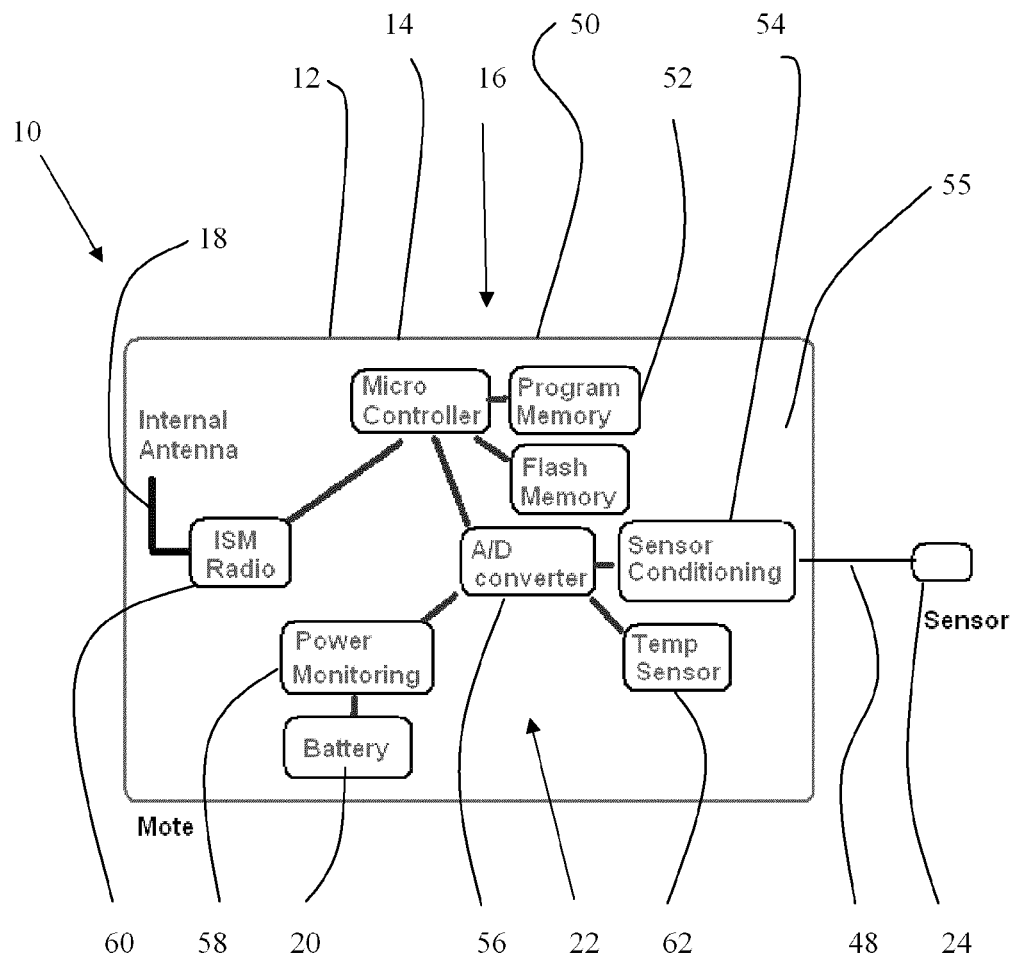
FIG. 2 shows schematically a wireless mote.

Referring to FIG. 2, wireless mote 10 includes a body 12 within which other components 22 are completely sealed. Body 12 isolates these other components from all hazardous environments. Body 12 is preferably a molded body having all the internal components secured within it. In a preferred example, the internal components are assembled, and an epoxy resin 55 is injected around the components to create a monolithic body encapsulating the components without any internal cavities, such that each component is embedded within the epoxy resin. It will be understood that body 12 may be manufactured from any material that isolates interior components of wireless mote 10 from the ambient environment while allowing radio coupling between antenna 18 and data coordinator 30. It has been found that body 12 manufactured from epoxy resin meets these requirements for use in several environments. Preferably, the material will be rigid, heat resistant and impermeable.

Figure 3:
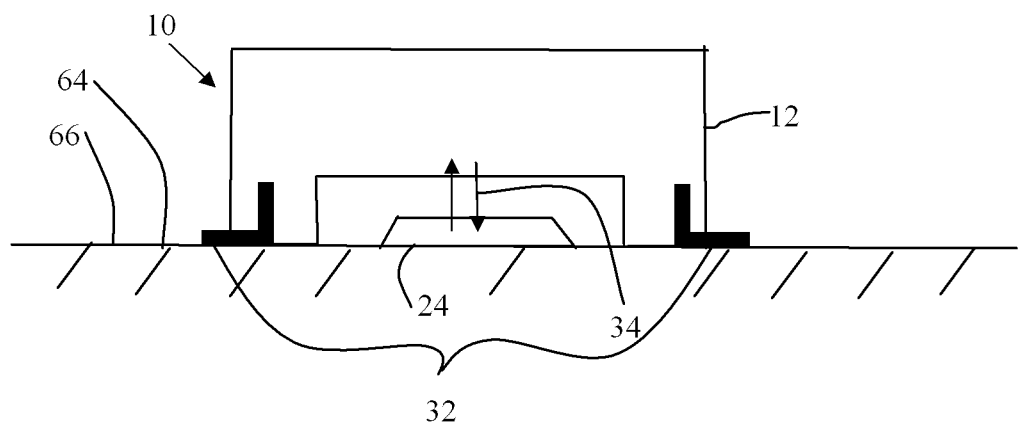
FIG. 3 shows a wireless mote situated adjacent to and surrounding a sensor.

Sealed within body 12 are a microcontroller 14, program memory 50, A/D converter 56, interface and conditioning electronics 54, wireless transceiver 60, at least one antenna 18, and a power source 20. One or more sensors 24 may be interfaced to other components 22 within body 12 through direct connection 48 to sensor interface and conditioning component 54. Sensors 24 may be any suitable sensor, such as one or more temperature sensor/transducer, pressure transducer, accelerometer, strain gauge, crack sensor, etc. and may be powered by mote 10 or have an independent power source. Other components may be included within the body such as program memory 52 which is preferably flash memory, data memory (not shown) which is preferably flash memory, temperature sensor 62, and a power management and monitoring block 58. Referring to FIG. 3, alternatively, sensor 24 external to body 12 and may be in wireless communication via a wireless link 34 with an adjacent wireless mote 10. Wireless link 34 may comprise a radio link comprising a transponder (not shown) embedded in sensor 24 and an interrogator (not shown) embedded in wireless mote 10. Alternatively, wireless link 34 may be an inductively coupled link. In FIG. 3, wireless mote 10 is shown attached to a surface 64 of a component 66 of equipment and situated surrounding sensor 24. Wireless mote 10 is attached at surface 64 by welding metal tabs 32 of wireless mote 10 to component 66. Alternatively, body 12 may be attached to surface 64 using epoxy compounds. Alternatively, a permanent magnet within body 12 may couple with a magnetic material in component 66 and maintain a force of attraction to keep the body 12 in contact with surface 64.

Components 22 within the body 12 provide capability to sense at least one of tilt/vibration/acceleration integrally with wireless mote 10. A signal provided from component 22 may be used to activate and control actions such as logging and temperature sensing. Such activations can be used to interface the operation or functions of the wireless mote with the user. Further, wireless mote 10 may be attached to a rotating component of equipment, for example a rotating shaft, so as to measure the environment, behaviour and phenomena experienced by said component, including vibration, acceleration, etc. and so provide data on the status of said component during operation and to provide an alarm when predetermined values for criteria are exceeded or to acquire data or perform a task according to the orientation or rotational position of the wireless mote 10. Component 22 could also integrate into the power management functions to wake the sensor from a low power mode to become active upon the occurrence of a predetermined condition, such as sensing motion of the attached equipment. Preferably, the wake/sleep, or active/inactive state of wireless mote 10 is controlled by an element that is distinct from the wireless transmitter used to transmit the sensor data. For instance, wake/sleep when the sensor is in a certain orientation or motion, or wake/sleep upon a certain magnitude of shock, or wake/sleep on a certain amount of vibration. Alternatively, the power management functions such as wake/sleep could be activated on a "gesture" which is a combination or pattern thereof of orientation, motion, shock and vibration. In yet another embodiment, the gestures, or tap sensitive interface, could be used to control other functions of the sensor. Other examples include an RF transponder (such as a radio frequency identification tag), where an RF interrogator that comes into range, or leaves the range, of the RF transponder in wireless mote 10 would cause it to change states, and a magnetic sensor that may be either an element that senses a magnetic field or a switch that is activated by a magnetic field, could be activated by a magnetic element being placed on or near an external surface of the wireless mote 10. Moreover, the magnetic element could be moved in a three dimensional pattern to form a gesture. Generally speaking, the wireless transmitter uses a significant portion of the available power. By providing these other elements, which use little or no power, to switch the wireless mote between wake/sleep states, it allows more power to be conserved. For example, the accelerometers required for the gestures require little power, or may be powered by the gesture itself, and the RF transponder may be designed to be powered by the RF signal it receives from the RF interrogator. Similarly, the magnetic sensor requires little or no power between switching states.

Other power management options include harvesting energy from the environment, such as thermal energy, solar energy, kinetic energy, or energy from radio waves.

Referring again to FIG. 1, other components 22 of wireless mote 10 may include program memory 50 for microprocessor 14, Flash memory 52, a conditioner 54 for conditioning signals from sensor 24, a temperature sensor 62, an analog-digital converter 56 for converting signals from sensor 24 and temperature sensor 62, a monitor 58 for monitoring the status of power source 20, an ISM radio 60 for communication between microprocessor 14 and antenna 18, and a magnetic on-off switch or sensor 124 capable of being activated remotely.

Figure 20:
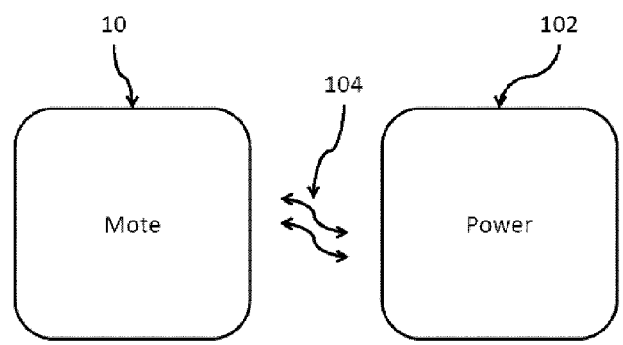
FIG. 20 is a block diagram showing the wireless mote wirelessly receiving power from an external power source.

Power source 20 may be at least one battery, or may be a rechargeable electrical power storage unit for storing electrical power harvested from solar energy, vibration, heat, or an inductively coupled electrical source, coupled inductively to wireless mote 10 so as maintain the seal provided by body 12. Alternatively, referring to FIG. 20, wireless mote 10 may be powered by an inductively coupled 104 power source 102. Power source 102 could be any form of power source such as a battery. Alternatively, wireless mote 10 may recharge its internal battery through inductively coupled 104 power source 102.

Figure 4:
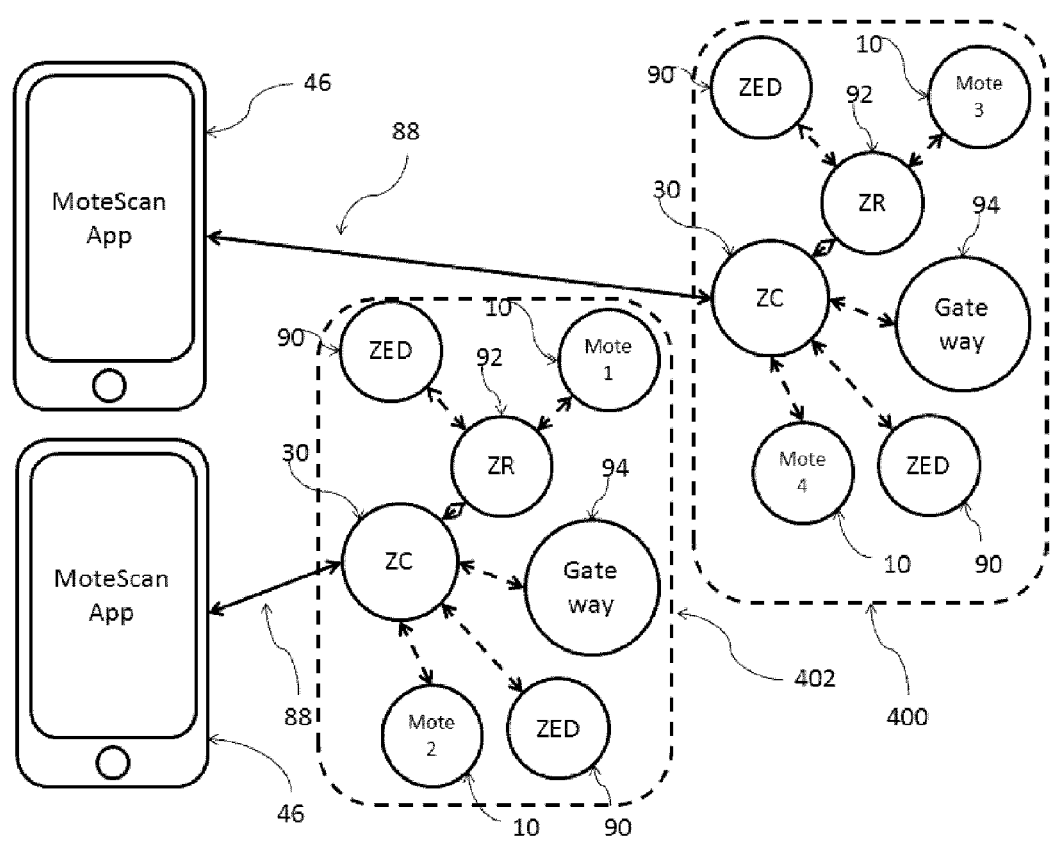
FIG. 4 shows a series of wireless motes in communication with a coordinator.
Figure 17:
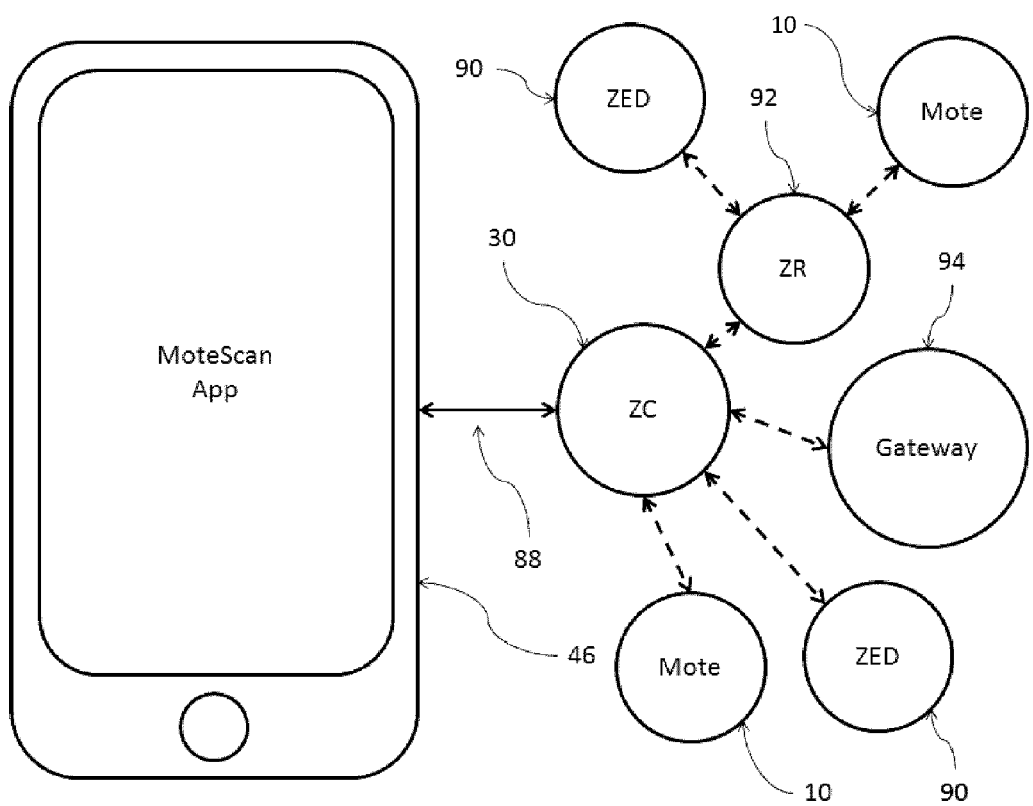
FIG. 17 is a block diagram of a computer connected to a data coordinator using a wired connection.

Referring to FIG. 4, multiple RF channel selection capability at wireless mote 10 and data coordinator 30 allows multiple networks 400 and 402 to operate within communication distance of each other. Alternatively, data coordinators 30 for networks 400 and 402 maybe connected to a single computer 46 to facilitate download of data from multiple data coordinators 30 via communications software 28 to a single computer 46. A plurality of wireless motes 10 communicates data via communications software 28 to data coordinators 30. When a wireless mote 10 is located at a blind spot with respect to data coordinator 30, signals are transmitted via one or more intermediate routers 92 as illustrated in FIG. 4 and FIG. 17. In FIG. 4, wireless "mote 3" communicates in this fashion via wireless "mote 2" to coordinator 30. Wireless motes 10 may also be configured to operate in a mesh network to communicate data.

Figure 18:
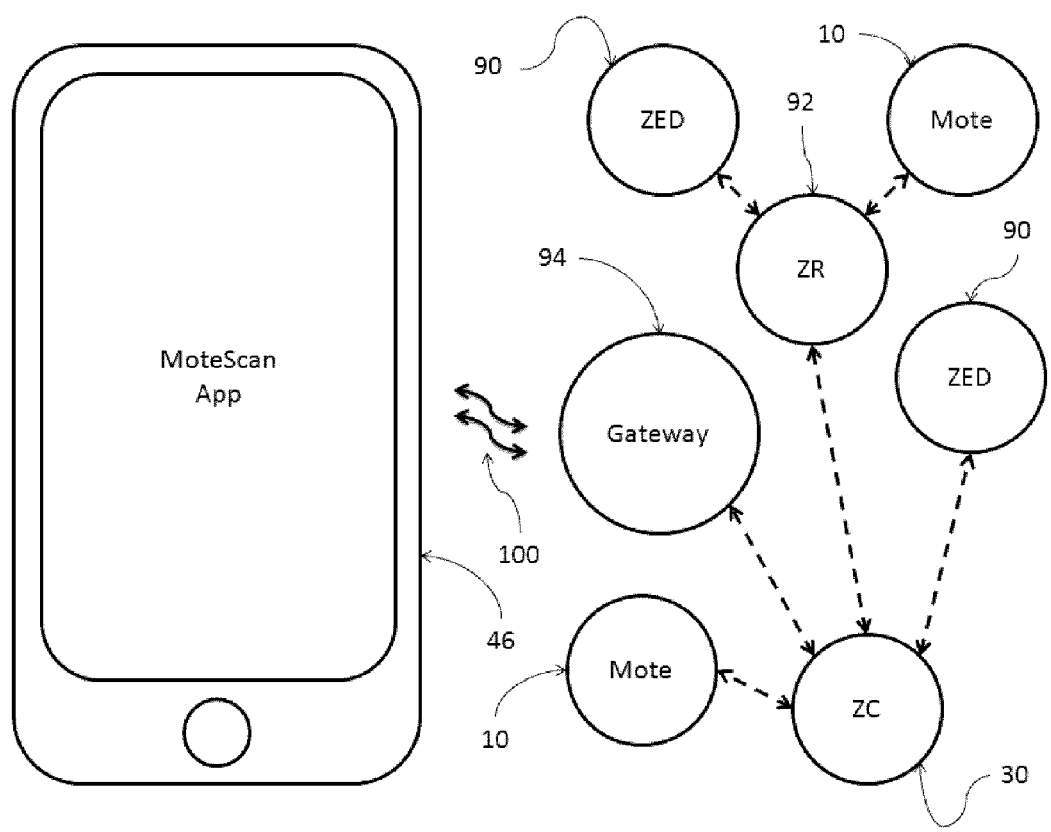
FIG. 18 is a block diagram of a computer connected to a gateway using a wireless connection.

Referring to FIG. 17, data coordinator 30 may be connected to computer or mobile device 46 using a wired connection 88 such as the 30 pin data connector on an Apple iPod, iPhone or iPad or a USB connector on a portable computer. Data coordinator 30 is in wireless communication with Mote 10, end devices 90, router 92 and gateway 94. Alternatively, computer or mobile device 46 may be in wireless communication 100 with gateway 94 using any form of wireless communication available within computer 46 such as Bluetooth, Wi-Fi, or cellular modem as illustrated in FIG. 18.

Data coordinator 30 is optionally provided for high speed data downloads. Software is installed providing an algorithm for data re-sampling to correct for time base errors. In this way, time base errors arising from data gathering using a multiplicity of wireless motes are corrected to enable alignment of time data from all wireless motes. Data coordinator 30 analyzes principal components of multi-channel input. In one example, different strain gauges may measure strain in different directions at a site on a component of equipment, and data coordinator 30 is capable of analyzing the data from the different strain gauges to determine the vector of the strain at that site on the component. Data coordinator may be programmed to perform either Rainflow or histogram analysis of data, thus determining extent and frequency of occurrence of the parameter being monitored. Miner's rule (discussed below) may be further applied to estimate or predict time to failure.

Power management is implemented to reduce power consumption to improve lifetime of power source 20. Multiple level power saving techniques may be used by programming wireless mote 10 to perform one or more of the following means:

operating during sampling only, so that the sensor is in an on state only just before a reading, and then is switched off;

deep sleep mode, in which an external signal is required to reactivate wireless mote 10;

operating only the Rx transmitter;

operating only the Rx receiver for supervisory channel received signal strength indicator detection of a "wake up" code;

powering only clocking modes when other modes are switched off; and operating Tx radio/Rx on a periodic basis, that is, duty cycled.

Magnetic sensor 124 may be used to interrupt the power to the mote circuits and to reconnect. In general, motes are programmed to periodically "wake up" and go to "sleep" with the objective of saving power or to extend the life of one or more components. Typically, this is done in one of two manners. The first manner is to program "on" times for reading and data logging, e.g. the mote goes to "sleep" at a specific time and wakes up at a prescribed time or after a prescribed interval to take readings, and the cycle is repeated. The second manner to conserve power is to be in low power mode for the majority of time and to be fully powered up only at prescribed times at which it is to determine if there are messages received from controller 30 or an external device such as a computer; or to communicate with or download data to a data management system 30 or external device. In either case the mote is not necessarily "on" and capable of communications at all times. However, by keeping the previous state of the mote, including its view of wake/sleep state, projecting forward in an external database, then a user can talk to one or more motes in a virtual sense, i.e. it becomes possible to communicate with a database remote from both motes and user and thereby the database will provide the information as if the mote were active and in communication with the user. Thus, for example, a user at one site utilizes a coordinator (e.g. a master mote) to communicate to one or more motes, even when those motes are asleep.

A user normally would perceive that sleeping motes do not appear to exist because they are not in communication with other devices. However, user's computer can communicate with the database which has historical and forward projecting information. In this case, the user's view would merge the live mote data with the database data and show the real number of motes at any location. The database would also give information gathered during an earlier interaction to provide current status data, for example that a particular mote presently is "asleep" and that it will "wake up" at a particular time. In this manner, persistent forward and backward synthesis and correlation of the data will improve immensely a user's interaction with the wireless motes 10 when compared to prior art systems.

Additionally, magnetic sensor 124 can be activated remotely so as to "wake up" one or more specific wireless motes 10.

Sensor 24 is selected to provide measurement of strain, as in the present example. Optionally, sensor 24 might be another form of sensor for the measurement of cracks and crack propagation, motion, shock, acceleration, tilt, inclination, pressure, light, radiation, sound or chemical compounds. Each wireless mote 10 may be configured with a unique identity, in which case data coordinator 30 would provide that identity with each set of data transmitted. Data coordinator 30 has integrated capability for data logging and data analysis. Data compression may be integrated to improve memory efficiency or reduce network bandwidth. Through these capabilities, wireless mote 10 can examine data live, extract salient information and, if desired, perform analysis at wireless mote 10, in whole or in part.

Metal tabs 32 are optionally provided to enable attachment of wireless mote 10 to a component of equipment. Metal tabs 32 may be attached to the component by welding or by resilient adhesive. As can be seen, metal tabs 32 are partially embedded in wireless mote 10 Metal tabs 32 may be dielectrically isolated from microprocessor 14 of wireless mote 10 to prevent interference or effects from electrical charging at the component.

Microcontroller 32 can be reconfigured wirelessly. This process involves using Flash storage 52 to maintain a record of the configuration or "personality" of wireless mote 10, and to record data. Further, flash storage 52 can be used to record a copy of the mote's software program which can be programmed into the microcontroller 32.

Figure 5:
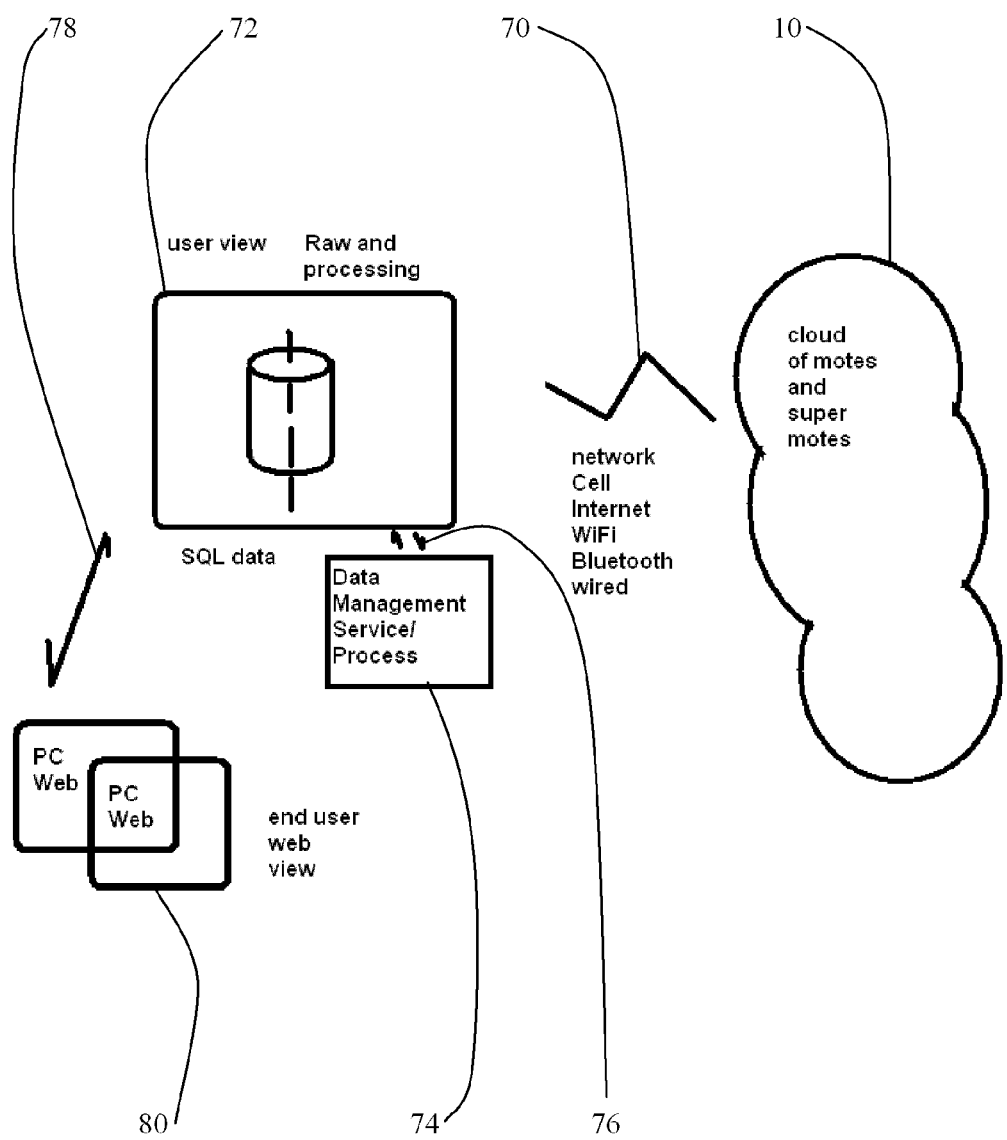
FIG. 5 illustrates one method for management of data received from wireless motes shown in FIGS. 1 through 4.

What also is required is management of data received from a plurality of wireless motes 10, for which one option is illustrated in FIG. 5. Data from wireless motes 10 is communicated by a link 70 using any of several conventional means to a database 72, for example a SQL system. Raw data and processed data are stored at database 72. Raw data is processed at a data management service system 74 in communication over link 76 with database 72. Abstracted data are communicated to an end user 80 via communications links 78, which may be web intermediated via the internet, cell phone or a Bluetooth device. Abstracted data that may be communicated include life time of one or more components of wireless mote 10, or warnings concerning readings by a sensor 24 that are outside predetermined limits, or results of rainfall data analysis performed at wireless mote 10 or data management service system 74. End user 80 can communicate commands via database 72 to wireless motes 10.

Figure 6:
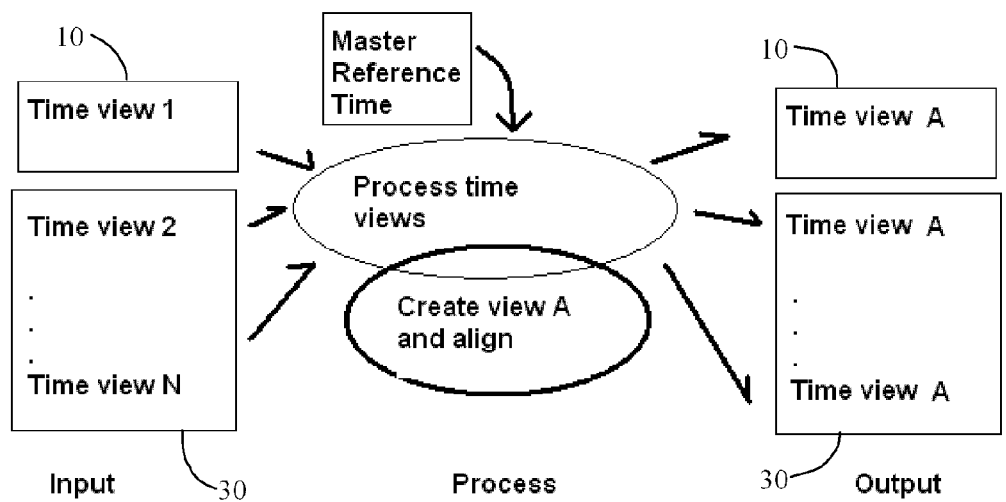
FIG. 6 shows a schematic of the synchronization of motes.
Figure 7:
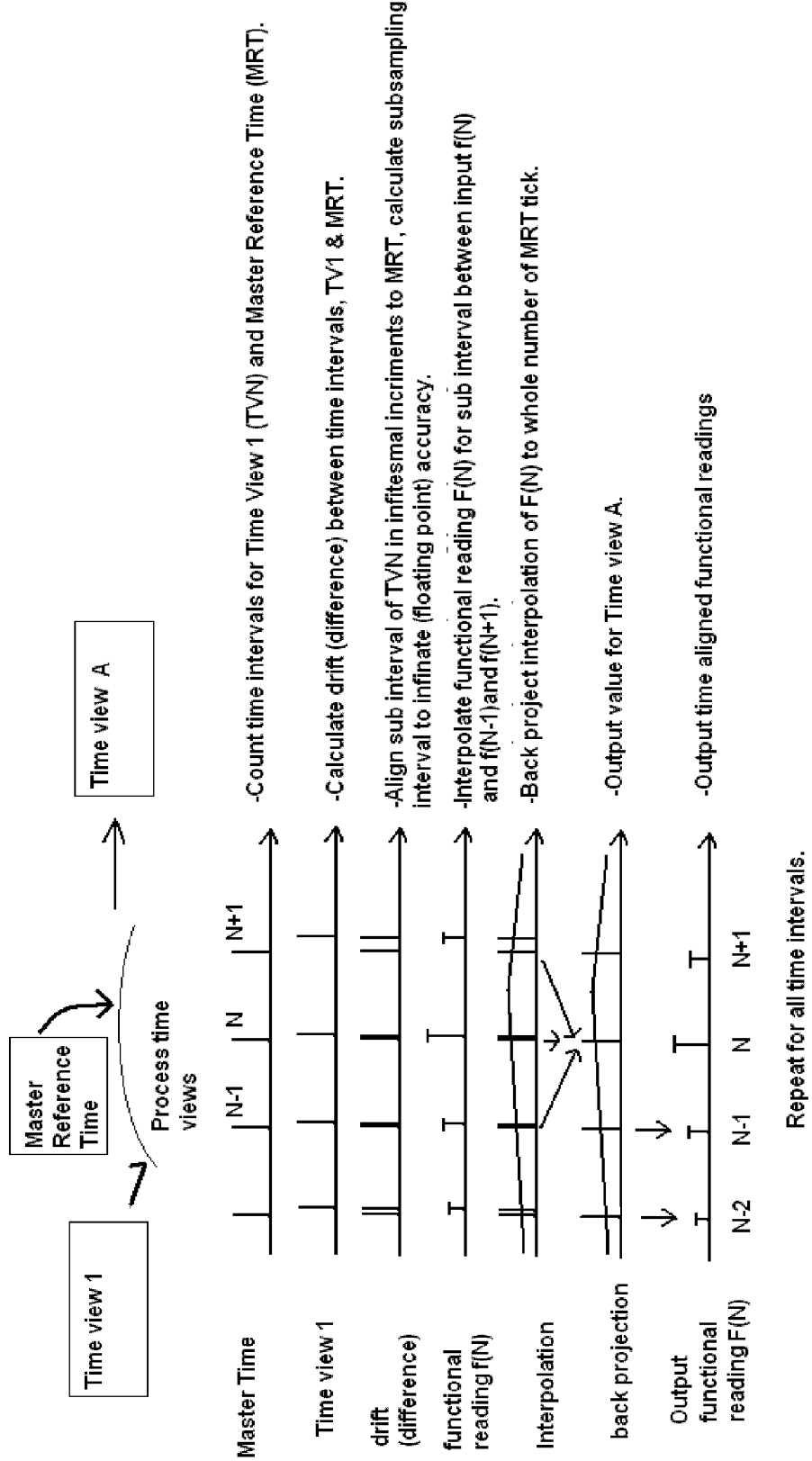
FIG. 7 illustrates an algorithm for quasi-asynchronous to isochronous to synchronous conversion of data from wireless motes.

Referring to FIG. 6, advantages may be had by synchronizing time between each wireless mote 10 and controller 30 so that all wireless motes 10 operate in a synchronized manner. Referring to FIG. 7, an algorithm for quasi-asynchronous to isochronous to synchronous conversion is provided to align in multimode manner multiple asynchronous motes so that data received from said wireless motes 10 or communicated between them is synchronized before analysis.

Figure 19:
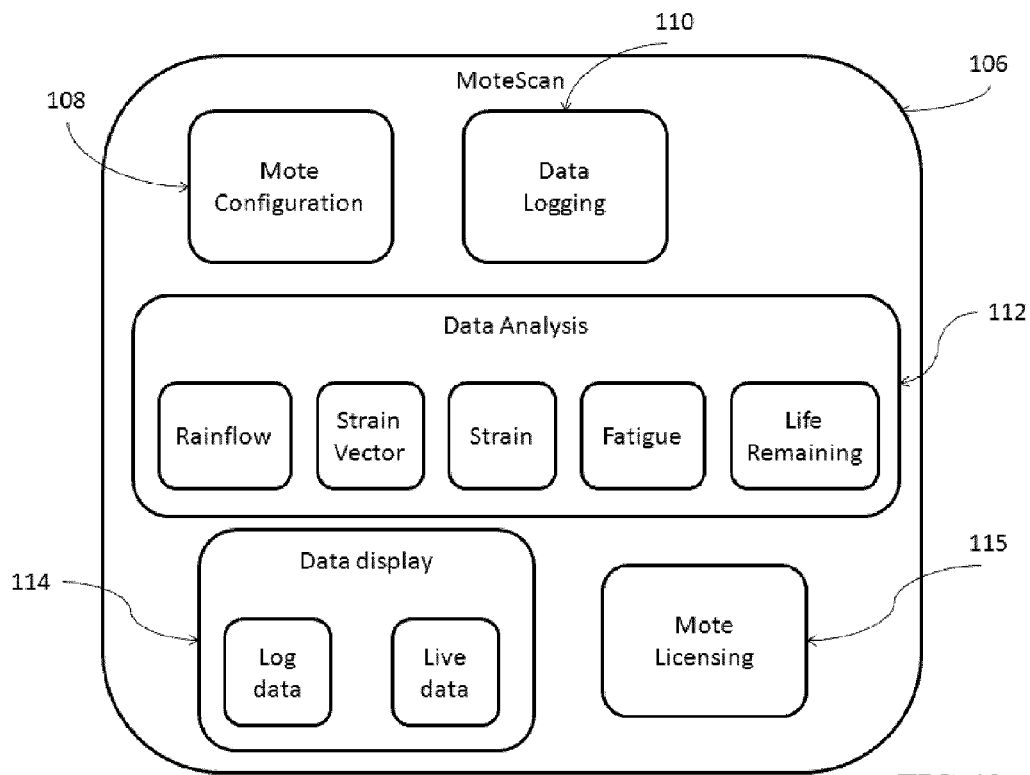
FIG. 19 is a block diagram of functions performed by the software installed

Referring to FIG. 19, the functions of a preferred implementation of the software 106, referred to as "MoteScan" are illustrated and include mote configuration 108, mote licensing 115 and data logging function 110. Mote configuration 108 allows setting various parameters for the mote, which may include sampling rate, sampling period, sampling duration, sampling repetition cycle and sampling signal channels. The data logging 110 stores the selected sampling signal channels to the internal memory on the mote. Mote licensing 115 ensures that a valid license is present for the selected mote. If a license is not present, the MoteScan will not communicate with the mote or download data. MoteScan scan software 106 has the ability to analyze data in real time using data analysis algorithms 112 and display the results, including log data and live data, using data display 114. For example, software 106 may implement algorithms to calculate a strain vector, strain, fatigue, estimate life remaining, and/or a Rainflow algorithm may be applied to various histories to enable real time analysis of data received from one or more sensors 24. A Rainflow algorithm is commonly used in the analysis of fatigue data to reduce a spectrum of varying stresses into a set of stress reversals. Details of one implementation of a Rainflow algorithm will be discussed below in the context of fracture and fatigue analysis. Miner's rule may then be used to analyse the data, such as fatigue data. This rule, variously called Miner's rule or the Palmgren-Miner linear damage hypothesis, had first been proposed by A. Palmgren in 1924 and was popularized in 1945 by M. A. Miner. It states that where there are k different stress magnitudes in a spectrum, $S_i$ ($1 \le i \le k$), each contributing ($S_i$) cycles, then if $N_i(S_i)$ is the number of cycles to failure of a constant stress reversal Si, failure occurs when:

$$\sum_{i=1}^{k} \frac{n_i}{N_i} = C$$

C is an experimentally defined constant related to the component under stress, and is generally between 0.7 and 2.2.

Figure 10:
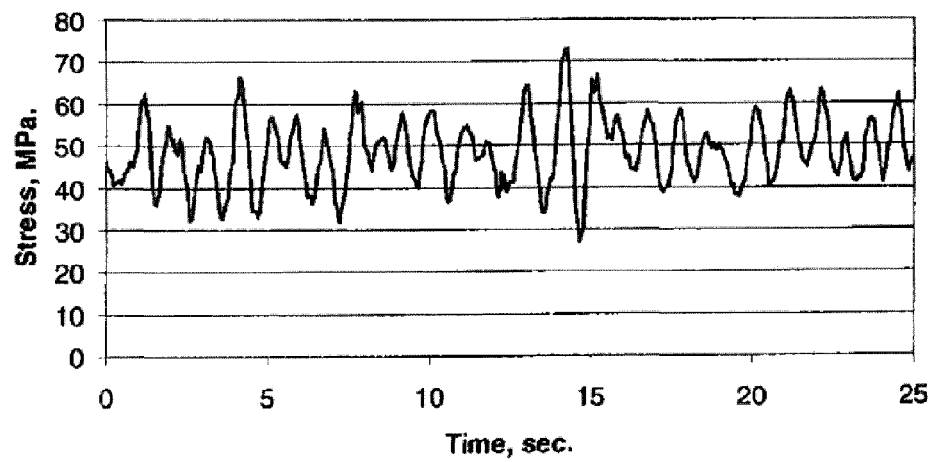
FIG. 10 is a graph depicting a random load history of a piece of heavy machinery driving on a haul road.

A Rainflow algorithm may be particularly useful in analysing random structural loading experienced by, for example, mobile equipment or stationary structures exposed to random vibrations and forces. It allows the load history, or the sequence of stresses experienced by a structure, to be measured by developing a load spectrum. The resulting data can be used for fatigue lie calculations and for predicting crack growth rates in structural components. An example of a load history can be seen in FIG. 10.

Figure 11:
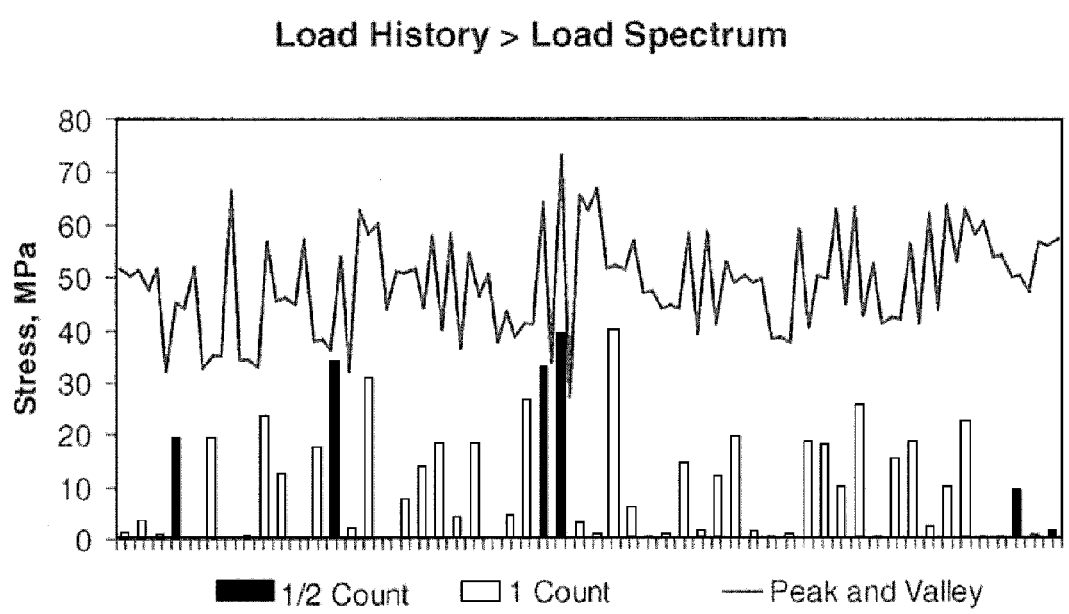
FIG. 11 is a graph depicting the results of a cycle counting algorithm.

Cycle counting is used to summarize irregular load-time histories by providing the number of times cycles of various sizes occur. An example of a Rainflow cycle counting may be defined by the steps indicated below, where X represents the range under consideration, Y represent the previous range adjacent to X and S, the starting point in the history. The steps are based on cycled counting, where the original data set has been reduced to peak and valley points only. The resulting cycle counting is illustrated in FIG. 11.

1) Read the next peak or valley. If out of data, go to Step 6.
2) If there are less than three points, go to Step 1. Form ranges X and Y using the current three peak and valley points. Ensure that the points used have not been previously discarded.

3) Compare the absolute values of ranges X and Y. If X<Y, go to Step 1; if X≥Y, go to Step 4.

4) If range Y contains the starting point S, go to Step 5; otherwise, count range Y as one cycle, discard the peak and valley of Y and go to Step 2.

5) Count range Y as one-half cycle, discard the first point in range Y, move the starting point to the second point in range Y and go to Step 2.

6) Count each range that has not been previously counted as one-half cycle.

Figure 12:
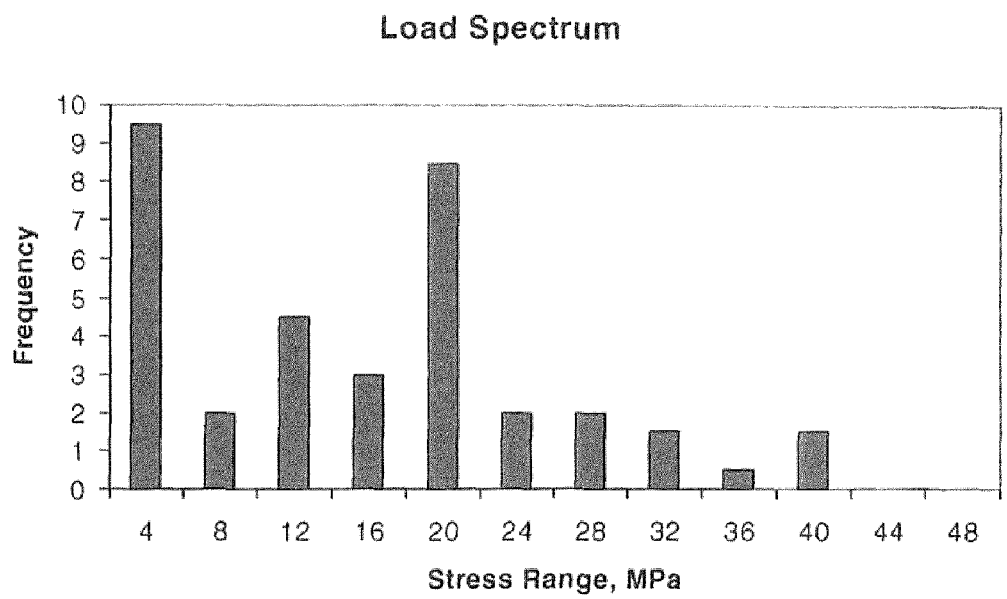
FIG. 12 is a graph depicting a histogram of discrete stress ranges.

Once all the cycles are counted in a data set, they may be ordered in a histogram within discrete stress ranges. This reduces the data to a specified number of stress range bins with the number of recorded cycles in each bin given by frequency, as shown in FIG. 12. This spectrum may then be used to describe load history data for fatigue and fracture analysis.

Internal Control Elements

Figure 13:
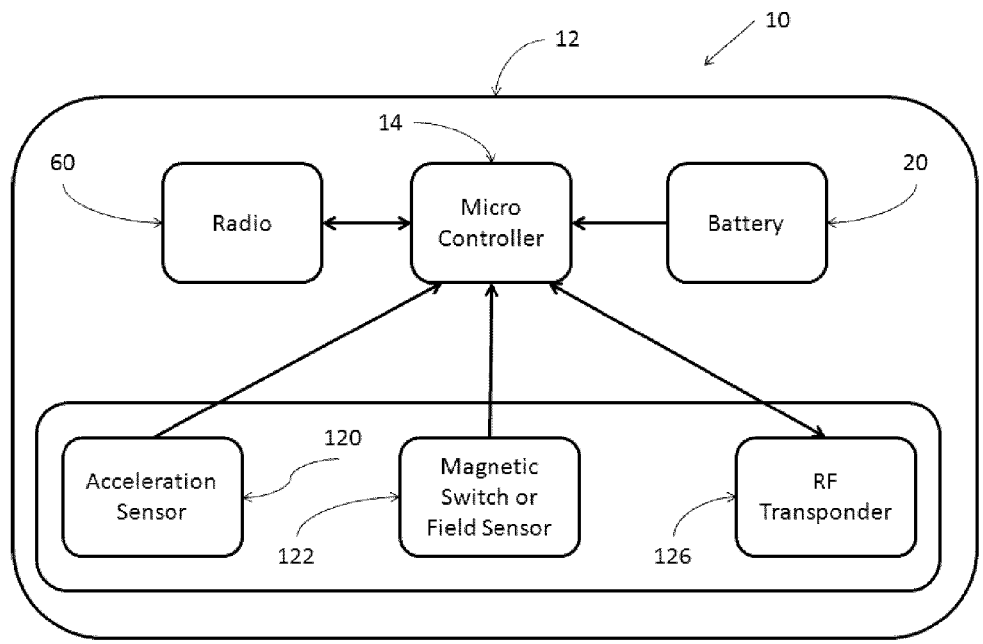
FIG. 13 is a bock diagram of a wireless mote with internal control elements.

Internal control elements are included in body 12 to allow a user to change the function of the embedded firmware between states. As body 12 is preferably a molded body solid with all the components embedded within the material, the one or more internal control elements will be physically isolated from an exterior surface of body 12. This allows internal control elements to change the state of the mote without compromising the inherently safe characteristics of body 12. Internal control elements may, for example, change the state to communicate in a different manner, or change between a wake/sleep state to help conserve power or otherwise. Referring to FIG. 13, a block diagram of an embodiment of wireless mote 10 is shown in a body 12. Body 12 contains a microcontroller 14, a radio component 60, and a battery 20. Body 12 also contains a number of internal control elements in communication with microcontroller 14, namely, an acceleration sensor 120, a magnetic sensor 122, which may be a magnetic field sensor or a magnetic switch, and an RF transponder 126, each of which can be used to control the wake/sleep state of wireless mote 10, as discussed previously. It will be understood that only one internal control element is required to allow the user to change state in this manner, however multiple elements may be included to enhance functionality.

Figure 14:
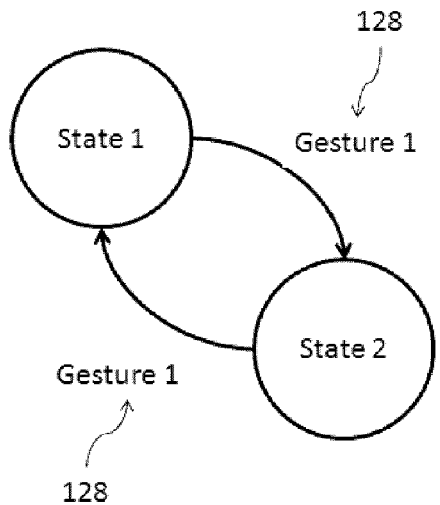
FIG. 14 is a state diagram of the microprocessor that changes states based on a gesture.
Figure 15:
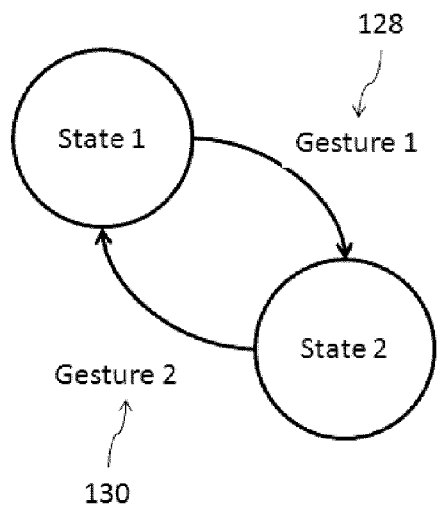
FIG. 15 is a state diagram of the microprocessor that changes states based on different gestures.
Figure 16:
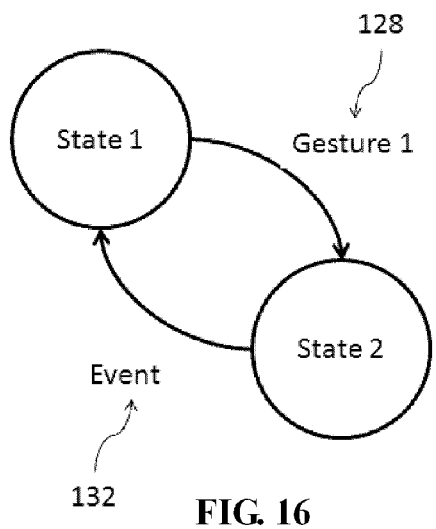
FIG. 16 is a state diagram of the microprocessor that changes states based on a gesture and an event.

In the case of an acceleration sensor, referring to FIG. 14, a gesture 128 may cause the function of the embedded firmware to change state. In this embodiment the change of state from State 1 to State 2 and back uses the same gesture 128. In the embodiment shown in FIG. 15, gesture 128 may cause the function of the embedded firmware to change from State 1 to State 2, while another gesture 130 causes the function to change from State 2 to State 1. In other embodiments, a predetermined event 132, rather than gesture 128, may cause the state to change. This is represented by FIG. 16, where gesture 128 causes the function of the embedded firmware to change from State 1 to State 2, and change of state back to another state occurs on event 132 such as an elapsed period of time or a programmatic condition. While two states have been depicted for simplicity, it will be understood that there may be more than two states, and different types of gestures or events that trigger a change of state, or a change of state may require both an event and gesture. Alternatively, a change of state may require the appropriate input into more than one internal control element. Other possibilities will be recognized by those skilled in the art, and will depend on the requirements and preferences of the user.

Algorithm for Alignment of Mote Time/Data

It is common to use dates and times to mark and record the occurrence of data or events. While not much thought is given to the precision of time when we talk in terms of years, months, days, hours and minutes, when it comes to seconds, milliseconds and nanoseconds the measurement of time is more complicated. In systems that record events with sub-second accuracies, the generation of accurate time sources is challenging. One common way to generate sub-second timing is to use crystal oscillators. A crystal oscillator has a natural oscillating frequency which is used to track the passage of time. However, no two crystals are precisely the same, which means that no two crystals will identically track the passage of time.

The presently described wireless motes may be designed to use crystal oscillators to track time. With respect to each other, these crystal oscillators drift over time. When a number of motes are used in a system, over long periods of time (such as minutes, hours, days or weeks) the mote times drift relative to one another. To realign the mote times and associated data a common time, typically the time on the host computer may be used. The host computer also uses a crystal oscillator. The host computer's crystal oscillator can be used as a base for timing, because it can be a common source of time for all the motes. An example of this type of process is described below.

When one or more motes are set to record they are also given the coordinator time which they store the mote's flash. When the motes are stopped by the coordinator, the coordinator's time is stored in the mote's flash. Post processing is used to realign the mote times to each other.

The mote recorded times are recalculated based on the coordinator start and stop times along with the number of samples taken by the mote. Data at ideal time steps are calculated by linearly interpolating two time adjusted mote data values that straddle the idea time.

Thus, to implement the coordination of time at each wireless mote with that at the host computer, the following algorithm may be implemented.

For each mote:

```
    for each data Channel in a mote:
coordDiffTime = coordinatorEndTime – coordinatorStartTime
moteDiffTime = moteEndTime – moteStartTime
iS = idealSampleInterval
iC = (coordinatorEndTime – coordinatorStartTime) /
numSamplesTakenByTheMote
foreach sampleNumber in dataChannel:
    # value of this sample
    val = dataChannel[sampleNumber]
    # re-calculate the time at which the sample was taken
    adjustedTime = coordinatorStartTime + sampleNumber * iC
    # record the data at the adjustedTime
    aData[adjustedTime][dataChannel][mote] = val
initialize prevMoteTime, dataPrev from aData
idealTime = coordinatorStartTime
sum = 0.0
intervalCount = 0
for moteTime,data in aData:
    # calculate the new value
    dataCur = data[0]
    # linearly interpolate between two mote samples to find the value at
    the idea time
    while prevMoteTime <= idealTime and idealTime < moteTime:
        iData = linearInterpolate( idealTime, prevMoteTime, moteTime,
            dataPrev, dataCur )
        interpData[cTime][dataChannel][mote] = iData
        intervalCount += 1
        # update the ideal time
        idealTime = coordinatorStartTime + intervalCount * iS
    prevMoteTime = moteTime
    dataPrev = dataCur
```

The resulting accuracy of timing alignment is only as accurate as the PC time used to re-calculate it. In addition, there is a sub-second network delay in sending the coordinator times to the motes for which compensation may be made. Regardless of the record period, there will always be a slight misalignment of the mote data due to the network delay. Similarly, as the frequency of crystal oscillators depends on temperature, it may be necessary to compensate for temperature variation.

Applications

Bolt Tightness—

Most industrial environments contain many bolts holding machinery and equipment in place. Some of these bolts are critical to the continued secure operation of the machinery, and the health and safety of the workers that operate them. Should these "critical bolts" fail, it may mean equipment damage, production downtime, injury of personnel, and perhaps even loss of life. The most common method of monitoring these critical bolts for tightness is to physically inspect each bolt and take a mechanical torque reading. At best, this is an imprecise way of measuring tightness due to the various conditions of the bolt threads, and the accessibility of the bolt itself.

One method of testing the bolts includes the torque method, where a standard torque wrench is used to torque each critical bolt to a predetermined torque reading. However, torque is a very imprecise method to determine the actual load that each bolt is bearing as it is only measuring how hard the operator pulled on the bolt to tighten it. Friction, especially as it applies to thread condition, can easily require the operator to have to "torque" the bolt with more force without increasing the subsequent load that the bolt must bear. Other methods include using hydraulic bolt tensioning tools, direct tension indictors or squirting washers, tension bolts, and load sensors.

Figure 8:
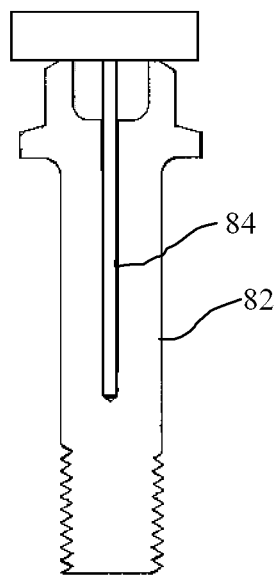
FIG. 8 is a side elevation view in section of a tension bolt sensor.
Figure 9:
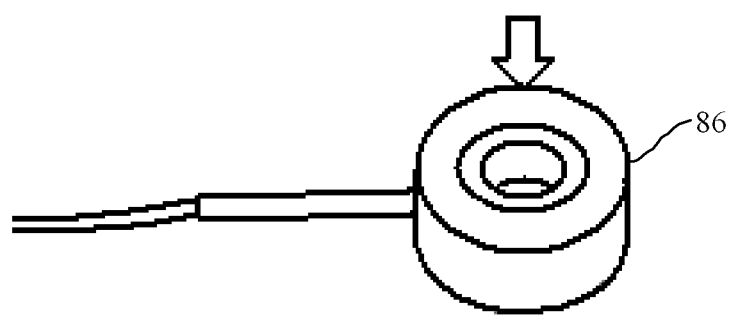
FIG. 9 is a perspective view of a load washer cell.

The sensor described herein may be used with a tension bolt or load sensor to give a precise reading of the load on the bolt. There are a variety of tension bolts and load sensors available on the market. Examples are shown in FIGS. 8 and 9. Referring to FIG. 8, a tension bolt 82 is shown, where a strain gauge 84 is placed inside the bolt to measure bolt elongation as it is tightened. This gives an inspector a precise reading of the load on the bolt. Referring to FIG. 9, a load washer cell 86 is shown, which does not require a strain device in the bolt, but rather may incorporate a strain device within with washer. The bolt is inserted through load cell 86, and the load cell then measures the amount of compression it finds itself under as the bolt is tightened. Once again, a very precise reading is obtained.

Strain Measurement—

Most heavy equipment experience strain, either tensile or compressive, on their critical parts. Invariably, this leads to fatigue of the material, and eventual failure of the critical component. Typical methods to measure strain include visual inspection, and strain gauges. The sensor describe herein may be used with a strain gauge to measure strain in equipment. Generally speaking, a strain gauge is designed to stretch or otherwise deform when a strain is placed upon it. As it deforms its electrical conductivity changes. This, coupled with the geometry of the device, as well as the number of devices being read, will give the inspector a precise reading of the amount and direction of strain. Rather than measuring magnitude, other strain gauges may be designed to detect the presence of a crack of a certain size by breaking and opening the electrical circuit through the gauge. One example of a strain gauge uses a metal foil to measure either the strain as the foil deforms, or cracks as the foil tears.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The following claims are to be understood to include what is specifically illustrated and described above, what is conceptually equivalent, and what can be obviously substituted. Those skilled in the art will appreciate that various adaptations and modifications of the described embodiments can be configured without departing from the scope of the claims. The illustrated embodiments have been set forth only as examples and should not be taken as limiting the invention. It is to be understood that, within the scope of the following claims, the invention may be practiced other than as specifically illustrated and described.

What is claimed is:

1. A wireless sensor device, comprising:
a processor connected to a wireless transmitter and at least one sensor that senses at least one environmental condition, the processor having two or more states;
a power source connected to power the processor and the wireless transmitter;
at least one internal control element for sensing one or more predetermined conditions, the internal control element switching the processor between states based on the occurrence of at least one predetermined condition, the at least one predetermined condition being unrelated to the at least one environmental condition sensed by the at least one sensor;
a molded body enclosing at least the processor, the wireless transmitter, and the internal control sensor such that the internal control sensor is physically isolated within the molded body; and
wherein the at least one predetermined condition comprises a gesture, and the gesture comprises a combination of two or more events selected from a group consisting of orientation, motion, shock and vibration events applied to the at least one internal control element.

2. The wireless sensor device of claim 1, wherein the molded body also encloses at least one of the power source and one or more sensors connected to the processor.

3. The wireless sensor device of claim 1, wherein the processor is connected wirelessly to a sensor that is external to the molded body.

4. The wireless sensor device of claim 1, wherein the processor is connected to an external sensor by conductors, a portion of the conductors being enclosed in the molded body.

5. The wireless sensor device of claim 1, wherein at least one internal control element is an accelerometer, and at least one predetermined condition is the detection of one or more predetermined accelerations.

6. The wireless sensor device of claim 1, wherein at least one internal control element is an RF transponder, and at least one predetermined condition is the introduction or removal of an RF interrogator from its detection radius.

7. The wireless sensor device of claim 1, wherein at least one internal control element is a magnetic sensor, and at least one predetermined condition is the introduction or removal of a magnetic element on an outer surface of the molded body.

8. The wireless sensor device of claim 1, wherein the molded body enrobes at least the processor, the wireless transmitter, and the internal control sensor in a single piece construction.

9. The wireless sensor device of claim 1, wherein the at least one sensor measures at least one of strain, cracks, crack propagation, motion, shock, acceleration, tilt, inclination, pressure, light, radiation, sound and chemical compounds.

10. The wireless sensor device of claim 1, wherein the processor is programmed to process sensor data from the sensing element according to an algorithm and transmit the processed data by the wireless transmitter.

11. The wireless sensor device of claim 10, wherein the algorithm is a Rainflow algorithm that generates a histogram of discrete stress ranges.

12. The wireless sensor device of claim 1, wherein the wireless transmitter is a wireless transceiver.

13. The wireless sensor device of claim 1, further comprising an attachment for attaching the wireless sensor to an object.

14. The wireless sensor device of claim 13, wherein the attachment is at least one of a magnet, at least one welding flange, strapping, or an adhesive compound.

15. The wireless sensor device of claim 1, wherein the sensor is a bolt tightness sensor.

16. The wireless sensor device of claim 1, wherein the processor is configured to operate as a node in a mesh network.

17. A method of operating a wireless sensor device, comprising the steps of:
  providing a wireless sensor device, comprising:
  a processor, a wireless transmitter, and at least one internal control sensor enclosed in a molded body, the processor being connected to the wireless transmitter, a power source, the internal control element, and at least one sensor that senses at least one environmental condition, the processor having two or more states and the internal control sensor being physically isolated within the molded body;
  configuring the internal control element to switch the processor between states upon the occurrence of at least one predetermined condition, the at least one predetermined condition being unrelated to the at least one environmental condition sensed by the at least one sensor;
  applying at least one predetermined condition to the internal control element; and
  wherein the at least one predetermined condition comprises a gesture, and the gesture comprises a combination of two or more events selected from a group consisting of orientation, motion, shock and vibration events applied to the at least one internal control element.

18. The method of claim 17, wherein the molded body encloses at least one of the power source and one or more sensors connected to the processor.

19. The method of claim 17, wherein at least one sensor is external to the molded body and connected to the processor wirelessly.

20. The method of claim 17, wherein at least one sensor is external to the molded body and connected to the processor by conductors, a portion of the conductors being enclosed in the molded body.

21. The method of claim 17, wherein at least one internal control element is an accelerometer, and at least one predetermined condition is the detection of one or more predetermined accelerations.

22. The method of claim 17, wherein at least one internal control element is an RF transponder, and at least one predetermined condition is the introduction or removal of an RE interrogator from its detection radius.

23. The method of claim 17, wherein at least one internal control element is a magnetic sensor, and at least one predetermined condition is the introduction or removal of a magnetic element on an outer surface of the molded body.

24. The method of claim 17, wherein providing the wireless sensor device comprises enrobing at least the processor, the wireless transmitter, and the internal control sensor in a single piece construction.

25. The method of claim 17, wherein the at least one sensor measures at least one of motion, shock, acceleration, tilt, inclination, pressure, light, radiation, sound and chemical compounds.

26. The method of claim 17, wherein the processor is programmed to process sensor data from the sensing element according to an algorithm and transmit the processed data by the wireless transmitter.

27. The method of claim 26, wherein the algorithm is a Rainflow algorithm that generates a histogram of discrete stress ranges.

28. The method of claim 17, wherein the wireless transmitter is a wireless transceiver.

29. The method of claim 17, further comprising an attachment for attaching the wireless sensor to an object.

30. The method of claim 29, wherein the attachment is at least one of a magnet, at least one welding flange, strapping, or an adhesive compound.

31. The method of claim 17, wherein the sensor is a bolt tightness sensor.

* * * * *